(12) United States Patent
Barton

(10) Patent No.: US 7,079,040 B2
(45) Date of Patent: Jul. 18, 2006

(54) THERMOSTATIC CONTROLLER AND CIRCUIT TESTER

(76) Inventor: Errol Wendell Barton, 111 SE. 4th Ave., Apt #9, Hallandale Beach, FL (US) 33009

( * ) Notice: Subject to any disclaimer, the term of this patent is extended or adjusted under 35 U.S.C. 154(b) by 0 days.

(21) Appl. No.: 10/047,712

(22) Filed: Jan. 7, 2003

(65) Prior Publication Data

US 2004/0130454 A1    Jul. 8, 2004

(51) Int. Cl.
G08B 21/00 (2006.01)
(52) U.S. Cl. .................. 340/657; 324/500; 700/276
(58) Field of Classification Search ............... 340/635, 340/657, 658, 659, 660, 664, 653, 661–663, 340/680, 652; 324/500; 700/276, 183, 278
See application file for complete search history.

(56) References Cited

U.S. PATENT DOCUMENTS 4,859,932 A * 8/1989 Whitley .................... 324/72.5
5,582,236 A * 12/1996 Eike et al. .................... 165/43
5,612,616 A * 3/1997 Earle .......................... 324/72.5
5,803,603 A * 9/1998 Schlueter ....................... 374/1
5,816,059 A * 10/1998 Ficchi et al. ................. 62/127
6,525,665 B1 * 2/2003 Luebke et al. .............. 340/635
6,826,454 B1 * 11/2004 Sulfstede ................... 700/276

* cited by examiner

Primary Examiner—Anh V. La
(74) Attorney, Agent, or Firm—Laurence A. Greenberg; Werner H. Stemer; Ralph E. Locher

(57) ABSTRACT

Thermostatic Controller and Circuit Tester is a new trouble shooting device, designed to improve the air conditioning technicians fault diagnostic capabilities. The device comes equipped with two independent circuits and its own built in flashlight. The first circuit is the controller, which is outfitted with test leads with alligator clips controlled by four push on-push off switches. When attached to the thermostat wires or the air handlers connector block, it allows the air conditioning system to be manually overridden, so as to determine and locate defects in the system. The next circuit, with detachable test leads and probes, performs line voltage and continuity tests.

20 Claims, 6 Drawing Sheets

FIG. 2
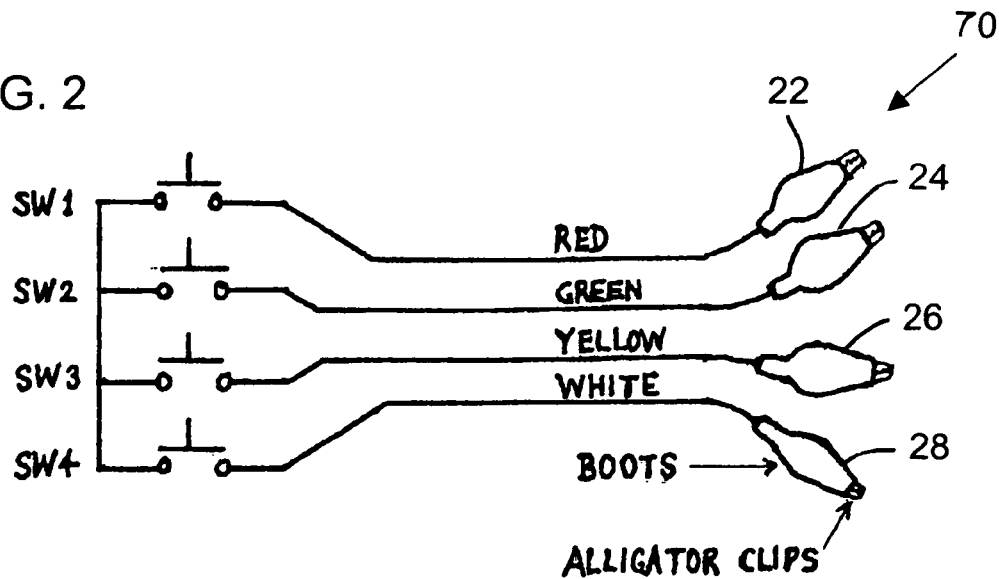
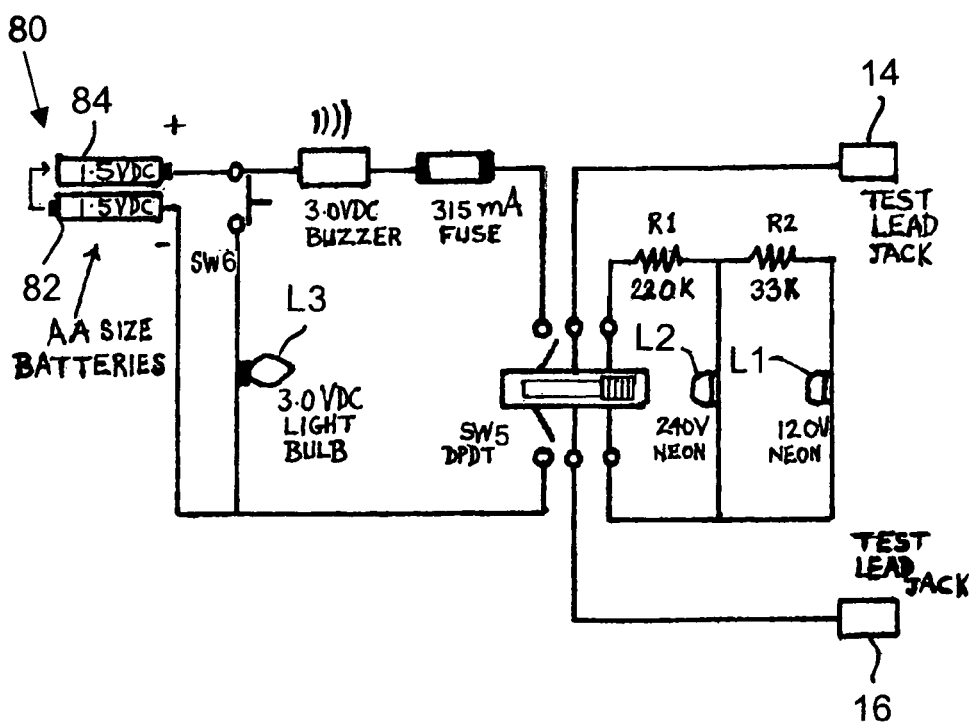
FIG. 3

THERMOSTATIC CONTROLLER AND CIRCUIT TESTER

BACKGROUND OF THE INVENTION

Field of the Invention

The present device is designed for use and deployment in the "HEATING VENTILATING AND AIR CONDITIONING" (HVAC) industry and relates to a thermostatic controller and circuit tester, and more particularly, to a portable thermostatic controller and circuit tester. This utility device along with its attributes, is the product of years of working and tolerating the shortcomings of current test equipment available to the trade.

Package units located on roofs or on the sides of buildings, air handlers and water cooled heat pumps located in dark closets and sometimes attics, sometimes pose a challenge to the technician, mainly because of their accessibility by ladders only.

This sometimes requires the technician to ascend and descend ladders to test the repairs made, by operating the thermostat, or he can shout down to someone (if available) to operate the thermostat.

SUMMARY OF THE INVENTION

A portable thermostatic controller and circuit tester is provided for the trades needs and demands as envisaged by the inventor, of whom, is a HVAC technician. This device is time saving and space saving, while giving the technician greater flexibility and latitude when working alone.

In one embodiment of the present invention, the thermostatic controller and circuit tester device comprises two separate circuits that performs independently of each other. The two circuits are never integrated, except when using the circuit tester to check continuity of the controller circuit, whenever necessary. In another embodiment of the present invention, the portable thermostatic controller device comprises at least a controller circuit and a built in flashlight.

The thermostatic controller and circuit tester, in accordance with the present invention, is ideal for fieldwork, in the workshop and classroom demonstration. But nowhere does its attributes comes into its own, than in fieldwork. That is when its usefulness is highlighted due to its diverse working environment.

With a thermostatic controller and circuit tester, in accordance with the present invention, all a technician needs to do is switch the thermostat to off and switch off the line voltage disconnect switch located on or nearby the unit, to off. Using the device of the present invention, the technician can then proceed to troubleshoot and make repairs. When repairs have been completed, a thermostatic controller and circuit tester, in accordance with the present invention, via a set of alligator clips, is then attached to the low voltage connector block or thermostat wire connections by removing the twist-on wire connectors and exposing the bare wires. The controller circuit can then be operated by pressing switches located on the face thereof.

With the portable device of the present invention, the technician avoids unnecessary trips to the thermostat location, saves time and energy and most of all he is now very independent of extra tools and helping hands.

BRIEF DESCRIPTION OF THE DRAWINGS

FIG. 2 is a schematic circuit diagram of a controller circuit of the thermostatic controller and circuit tester, in accordance with one embodiment of the present invention.

FIG. 3 is a schematic circuit diagram of a test circuit of the thermostatic controller and circuit tester, in accordance with one embodiment of the present invention.

Figure 1:
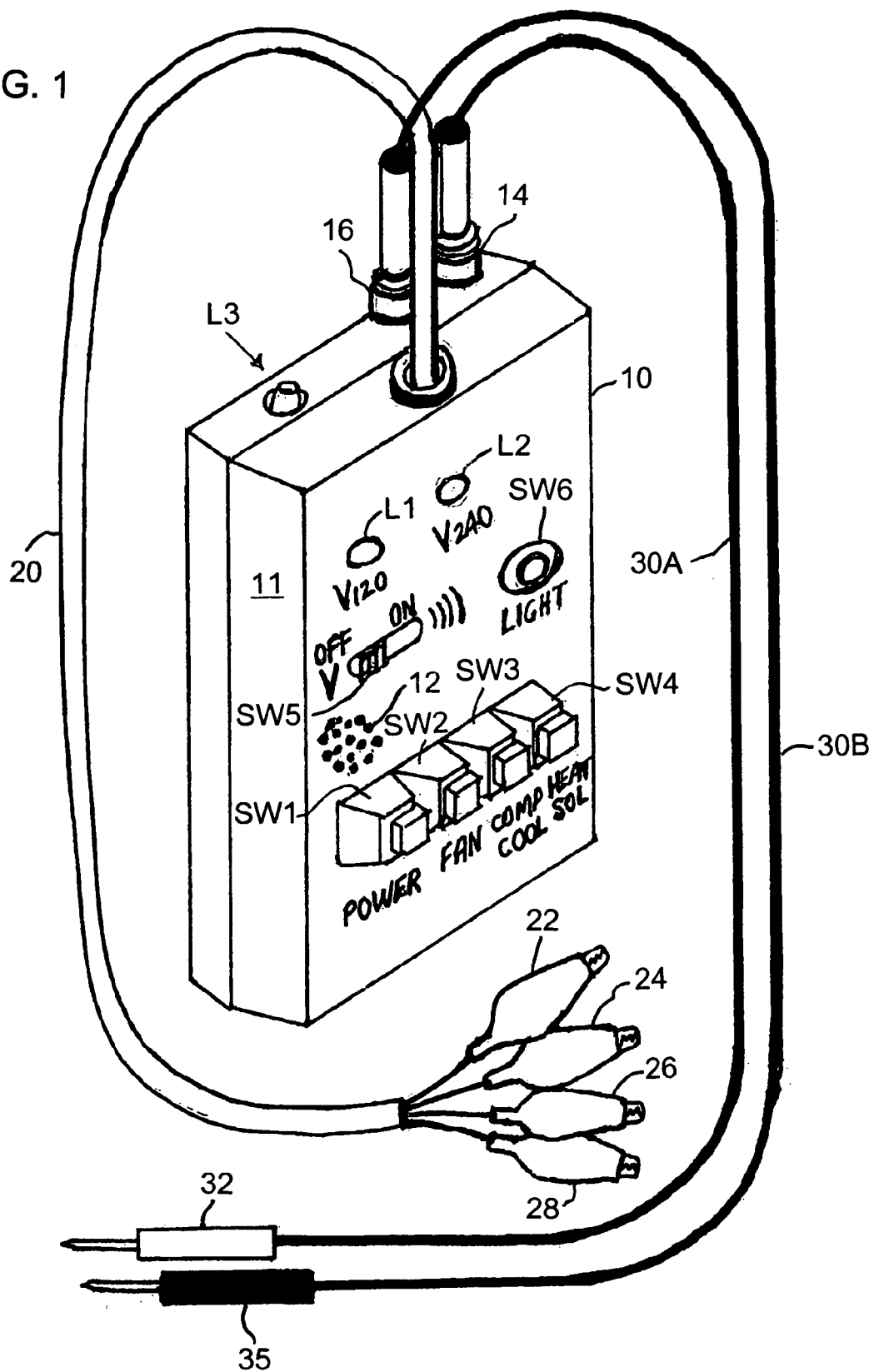
FIG. 1 is an isometric view of a portable thermostatic controller and circuit tester in accordance with one particular embodiment of the present invention.

Referring now to the figures of the drawing in detail and first, particularly, to FIG. 1 thereof, there is seen a portable thermostatic controller and circuit tester 10.

DESCRIPTION OF THE PREFERRED EMBODIMENTS

Referring now to FIGS. 1–7, there is shown a portable thermostatic controller and circuit tester 10 in accordance with a preferred embodiment of the present invention.

Once a technician has switched the thermostat of an HVAC unit to off and switched off the line voltage disconnect switch located on or nearby the unit, the portable thermostatic controller and circuit tester 10, can be used to troubleshoot the unit and to make repairs. Once repairs are completed, the alligator clips 22, 24, 26 and 28 are attached to the low voltage connector block or thermostat wire connections (as shown more particularly in FIG. 4) by removing twist-on wire connectors and exposing the bare wires. The technician can then go ahead and operate the controller circuit 70 of the portable thermostatic controller and circuit tester 10 by pressing the switches SW1, SW2, SW3, SW4, labeled in FIG. 1 as power, fan, cool and heat, respectively.

The Controller Circuit and how it Works

Referring now more particularly to FIG. 2. The controller circuit 70 is basically a kind of portable thermostat without the sensor and circuit board. There is no PC board of semiconductor components involved in its circuitry. It consists of four push on/push off switches SW1, SW2, SW3, SW4 arranged in parallel and soldered to four color coded wires, RED, GREEN, YELLOW, WHITE, 30 inches long from each switch with alligator clips 22, 24, 26, 28 soldered to the other ends of each wire RED, GREEN, YELLOW, WHITE.

Figure 4:
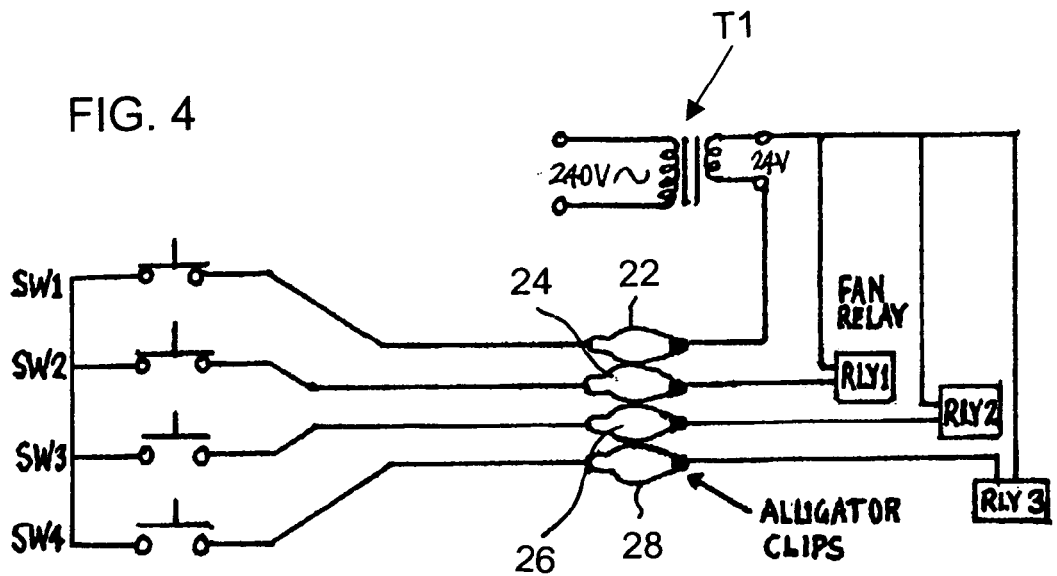
FIG. 4 is a schematic diagram of the controller circuit of FIG. 2 shown in use, connected to a connector block or thermostat wires of an HVAC unit, in accordance with the one embodiment of the present invention.

With reference to FIG. 2, switches SW1–SW4 are all in the normally open position, therefore making the circuit 70 off and inactive. In FIG. 4 switches SW1 and SW2 are engaged in the ON mode. Both switches are now energized. Switch SW1 passes low voltage power from the secondary output of the transformer T1 onto Switch SW2 which in turn passes the voltage to Relay RLY1. Relay RLY1 would then be energized and closed. This allows line voltage to flow via Relay RLY1 to the load. Switch SW2 is connected to the green wire, which in HVAC trade is universally associated with the fan or blower. As particularly shown in FIG. 4, switches SW3 and SW4 are still in the open position, but when energized and closed via Switch SW1, they perform their roles the same way as Switch SW2.

Table 1 is a table showing the switch positions for different controller applications.

TABLE 1

| APPLICATION | MODE | Red SW1 POWER | Green SW2 FAN | YELLOW SW3 COMP | WHITE SW4 HTR SOL | COMMENTS |
|---|---|---|---|---|---|---|
| HEAT PUMP | COOL | ● | ● | ● | ● | SOLENOID SWITCHES REVERSING VALVE TO COOLING MODE |
| HEAT PUMP | HEAT | ● | ● | ● | | SOLENOID INACTIVE REVERSING VALVE PRE-SET FOR HEATING |
| SPLIT SYSTEM | COOL | ● | ● | ● | | |
| SPLIT SYSTEM | HEAT | ● | ● | | ● | |

The thermostatic controller and circuit tester 10 can also be used to determine if a thermostat is defective or if there is a broken wire between the thermostat and the units that comprise the air conditioning system. To do so, simply switch off the thermostat breaker or the disconnect switch, then dismantle thermostat from wall. Disconnect thermostat wires from their terminals. Now connect the controllers alligator clips 22, 24, 26, 28 to the ends of the exposed thermostat wires, RED to RED, YELLOW to YELLOW or BLUE, GREEN to GREEN and WHITE to WHITE. Now go ahead and switch on the breaker or the disconnect switch. Operate the system by means of the controller's push on/push off switches SW1–SW4 of the thermostatic controller and circuit tester 10. The technician then makes his diagnosis based upon the unit's performance and his findings.

The Test Circuit and how it Works

Figure 5:
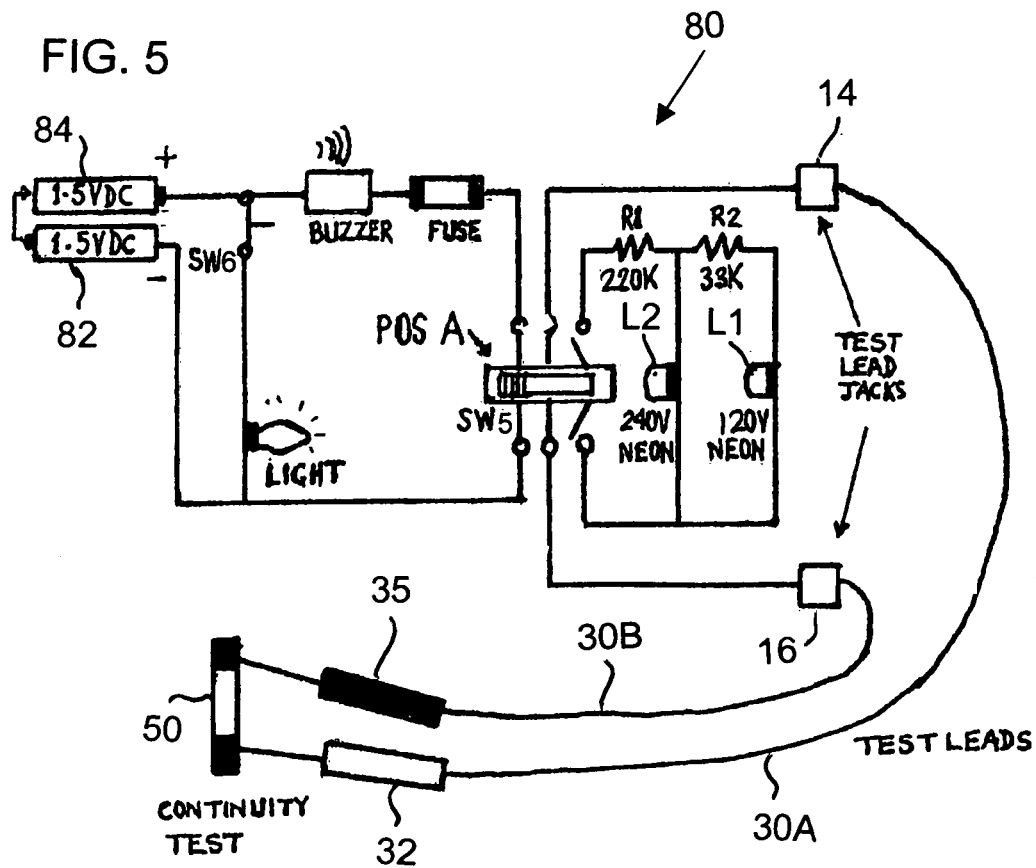
FIG. 5 is a schematic diagram of a circuit tester in accordance with one embodiment of the present invention.

In FIG. 5 there is an electronic circuit board (85 of FIG. 7) as part of a variable circuit. This circuit comprises a light source L3 (which is directed from the top face of the device 10, away from the front face, as shown in FIG. 1), a buzzer BUZZER for checking continuity and a tiny printed circuit board that consists of two bias resistors R1 and R2 and two neon lamps L1 and L2. The test circuit 80 is designed for testing AC voltage. The light L3 and buzzer BUZZER section of this circuit are powered by the two 1.5 VDC batteries 82, 84=3 VDC. A DPDT slide switch SW5 (on/off) is an integral part of this circuit and is used to switch roles.

Referring now to FIGS. 1–7, the circuit tester 80 and light source are operated as follows: the two 1.5 VDC batteries 82, 84=3 VDC are arranged in series. A 3 VDC pre-focused flashlight bulb L3 along with a momentary switch SW6 arranged in parallel, is fed by the batteries. The momentary switch SW6 was chosen, so as to save battery energy, by not being unintentionally left on for long periods.

This is the built-in flashlight operated by Switch SW6. The circuit 80 extends to a DPDT slide switch SW5.

From switch SW6 a 3 VDC buzzer BUZZER and a 315 MA quick blow fuse FUSE (for buzzer protection) are arranged in series and connected to one end of switch SW5 at position "A".

When switch SW5 is switched to position "A", the circuit 80 is now in the mode for continuity test. The middle tags of switch SW5 are connected to two output test lead jacks 14 and 16. As illustrated at the bottom of FIG. 5, when the circuit tester via the detachable test leads 30a, 30b and probes 32, 35 are brought into contact with a metallic object such as a fuse 50, the buzzer should emit an audible sound heard through the device casing holes (12 of FIG. 1) if the fuse 50 is good.

Figure 6:
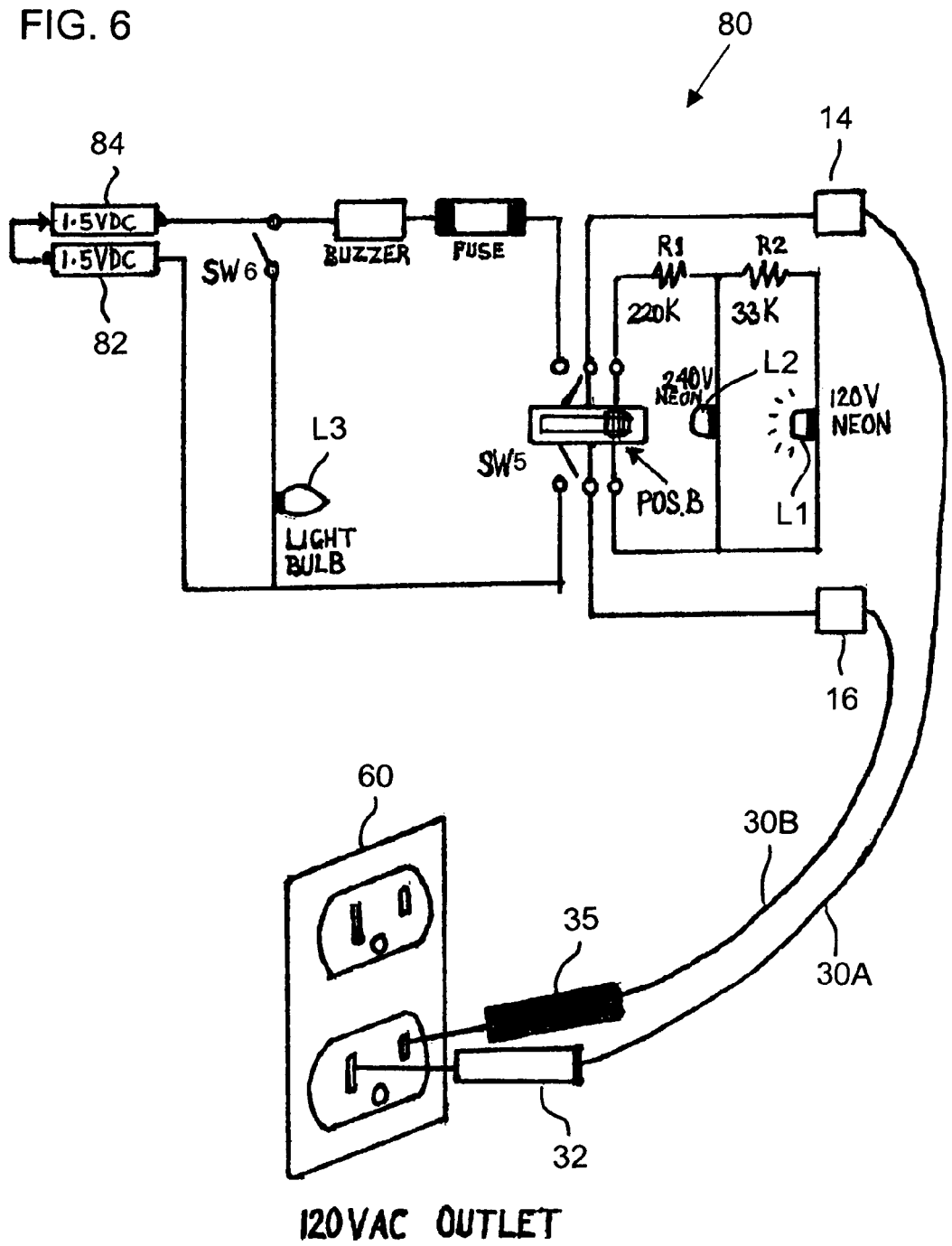
FIG. 6 is a diagram of the circuit tester of FIG. 5 being in use according to one embodiment of the present invention.

On the other side of switch SW5, the switch is now engaged in position "B" as illustrated in FIG. 6. This section of the circuit 80 includes series and parallel arrangements of two resistors R1 and R2 and two neon lamps L1 and L2. This is the voltage testing circuit.

The two bias resistors R1, R2, arranged in series, serves as a pair of controlling devices, that allows the right voltage to go to the right neon lamp L1, L2, thus illuminating it. The illustration in FIG. 6 shows the test probes 32, 35 inserted in a wall socket 60 of a 120 VAC receptacle.

R2 (33K) is the bias resistor for the 120 VAC neon lamp L1. With the test probes 32, 35 inserted into the 120 VAC wall socket 60, the lamp L1 will glow.

When the test probes are inserted in a 240 VAC source or outlet (not shown), the bias resistor R1 (220K) allows the 240 VAC neon lamp L2 to glow.

Figure 7:
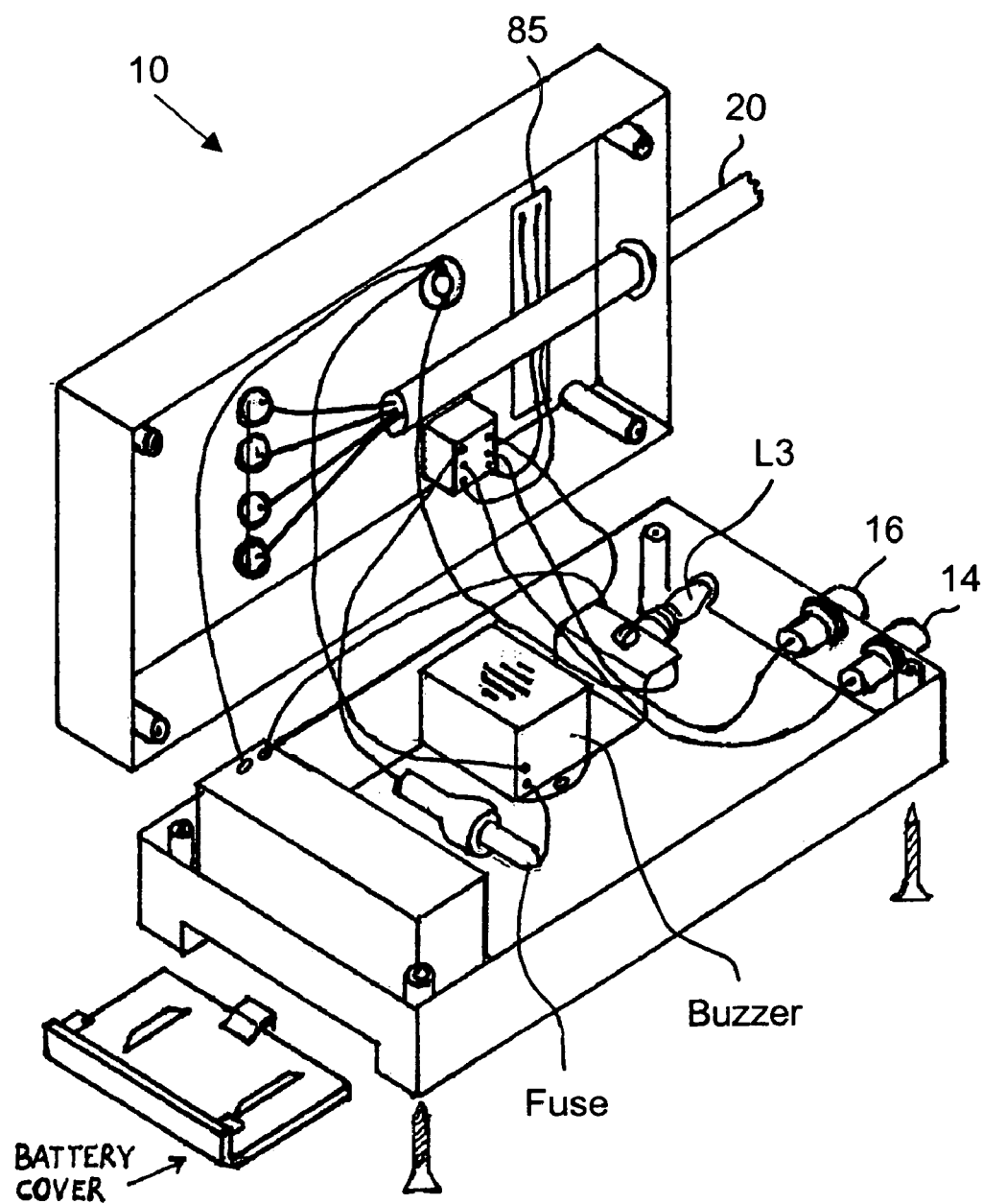
FIG. 7 is a partial exploded view of a portable thermostatic controller and circuit tester in accordance with one embodiment of the present invention.

When not in use, the test circuit 80 should be switched to position "B", which is also the off position for the battery's power. FIG. 7 illustrates the actual assembly of the device.

Figure 8:
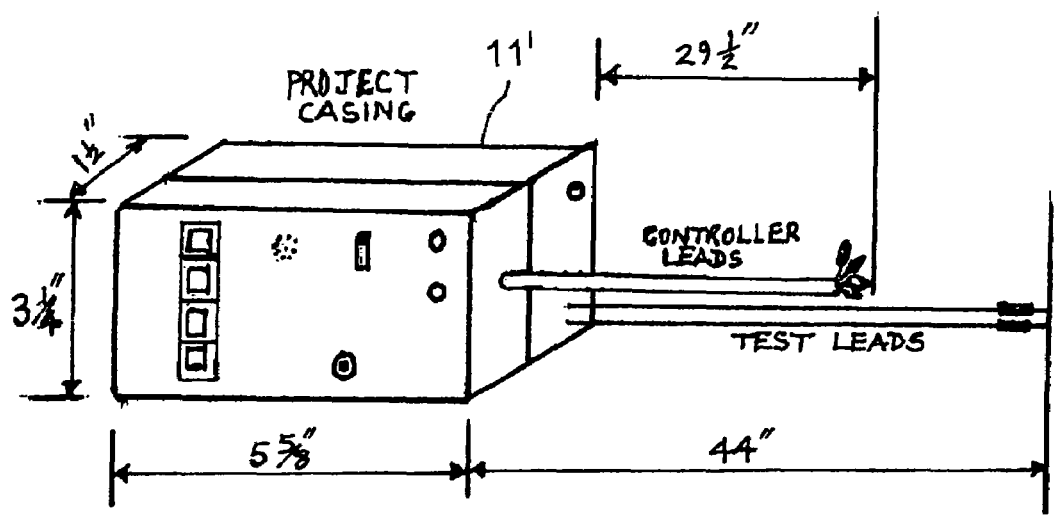
FIG. 8 is a front perspective view of a portable thermostatic controller and circuit tester in accordance with one particular embodiment of the present invention.

Referring now to FIG. 8, there is shown one particular embodiment of the portable thermostatic controller and circuit tester 10, wherein the project casing which houses the thermostatic controller and circuit tester 10 has specific dimensions. For example, in the embodiment of FIG. 8, the project casing which houses the thermostatic controller and circuit tester 10 is 5⅝ inches in length, 3¼ inches in width and 1½ inches deep. The controller leads extend 29½ inches from the project casing. Further, the test leads extend 44 inches from the casing 11'.

The invention claimed is:

1. A portable thermostatic controller for use with an HVAC unit located remotely from a thermostat, comprising:
    a controller circuit for connection to one of a controller block and thermostat wire connections associated with the HVAC unit, said controller circuit including a plurality of switches, wherein operation of said plurality of switches are used to control certain functions of the HVAC unit from said controller circuit, located remotely from the thermostat;
    a test circuit for testing at least one of continuity and voltage, said test circuit including an interface for selective connection with an element to be tested.

2. The portable thermostatic controller of claim 1, further including a built-in flashlight for illuminating an area at which said flashlight is directed.

3. The portable thermostatic controller of claim 2, wherein the state of said built-in flashlight is controlled by a flashlight switch located on the portable thermostatic controller.

4. The portable thermostatic controller of claim 3, wherein said flashlight switch is a momentary switch.

5. The portable thermostatic controller of claim 1, further including a plurality of wires operatively connected to said controller circuit to connect said controller circuit to one of a controller block and thermostat wire connections associated with the HVAC unit and located remotely from the thermostat.

6. The portable thermostatic controller of claim 5, wherein each of said plurality of wires includes a first end and a second end, wherein each first end is operatively connected to said controller circuit and each second end includes a clip for connection with said one of a controller block and thermostat wire connections, associated with the HVAC unit and located remotely from the thermostat.

7. The portable thermostatic controller of claim 1, wherein at least one of the certain functions of the HVAC unit controlled by said control circuit, remote from the thermostat is one of a fan function, a heating function and a cooling function of the HVAC unit.

8. The portable thermostatic controller of claim 7, wherein said test circuit includes a circuit for performing continuity testing.

9. The portable thermostatic controller of claim 8, further including test probes electrically connected to said test circuit, via said interface.

10. The portable thermostatic controller of claim 8, wherein said test circuit additionally includes a circuit for performing voltage testing.

11. The portable thermostatic controller of claim 10, wherein said test circuit additionally includes a switch for selecting between said voltage testing circuit and said continuity testing circuit.

12. The portable thermostatic controller of claim 1, wherein said test circuit additionally includes at least one indicator for indicating at least one of continuity and voltage level.

13. The portable thermostatic controller of claim 12 wherein said test circuit includes circuitry for testing continuity and wherein said at least one indicator includes an audible indicator.

14. The portable thermostatic controller of claim 12 wherein said test circuit includes circuitry for testing voltage and wherein said at least one indicator includes a visual indicator for indicating the presence of 120 VAC, when 120 VAC is detected by the voltage detector.

15. The portable thermostatic controller of claim 14 wherein said at least one indicator includes a second visual indicator for indicating the presence of 240 VAC, when 240 VAC is detected by the voltage detector.

16. A portable thermostatic controller for use with an HVAC unit located remotely from a thermostat, comprising:
    a casing including at least a front face and a top face;
    a plurality of switches accessible from the front face of said casing, wherein operation of said plurality of switches is used to control certain functions of the HVAC unit from a location remote from the thermostat;
    a controller circuit contained within said casing for connection to one of a controller block and thermostat wire connections associated with the HVAC unit, said controller circuit being operable by said switches, to control certain functions of the HVAC unit remote from the thermostat;
    a flashlight circuit, said flashlight circuit including a flashlight source and a flashlight switch, said flashlight source extending through the top face of said casing for illuminating an area at which said flashlight source is directed.

17. The portable thermostatic controller of claim 16, wherein at least one of the certain functions of the HVAC unit controlled by said control circuit, remote from the thermostat is one of a fan function, a heating function and a cooling function of the HVAC unit.

18. The portable thermostatic controller of claim 16, wherein said controller circuit is powered by the power source of the HVAC unit and said flashlight is powered by batteries contained in said casing.

19. A portable thermostatic controller for use with an HVAC unit located remotely from a thermostat, comprising:
    a controller circuit for connection to one of a controller block and thermostat wire connections associated with the HVAC unit located remotely from the thermostat, said controller circuit being used to control at least one of a fan function, a heating function and a cooling function of the HVAC unit;
    a test circuit for testing at least one of continuity and voltage, said test circuit including a pair of test probes for selective connection with an element to be tested between said pair of test probes.

20. The portable thermostatic controller of claim 19, further including a built-in flashlight for illuminating an area at which said flashlight is directed.

* * * * *

UNITED STATES PATENT AND TRADEMARK OFFICE
CERTIFICATE OF CORRECTION

PATENT NO. : 7,079,040 B2  
APPLICATION NO. : 10/047712  
DATED : July 18, 2006  
INVENTOR(S) : Errol W. Barton Page 1 of 1

It is certified that error appears in the above-identified patent and that said Letters Patent is hereby corrected as shown below:

Title Page
Item [76] should read as follows:

Errol Wendell Barton, 2237 N.W.170$^{th}$ Ave., Pembroke Pines, FL (US) 33028

Signed and Sealed this

Twentieth Day of February, 2007

JON W. DUDAS
*Director of the United States Patent and Trademark Office*